(12) United States Patent
Foulger et al.

(10) Patent No.: US 7,008,567 B2
(45) Date of Patent: Mar. 7, 2006

(54) ESSENTIALLY WATER-FREE POLYMERIZED CRYSTALLINE COLLOIDAL ARRAY COMPOSITES HAVING TUNABLE RADIATION DIFFRACTING PROPERTIES AND PROCESS FOR MAKING

(75) Inventors: Stephen H. Foulger, Clemson, SC (US); Ping Jiang, Clemson, SC (US)

(73) Assignee: Clemson University, Clemson, SC (US)

( * ) Notice: Subject to any disclaimer, the term of this patent is extended or adjusted under 35 U.S.C. 154(b) by 280 days.

(21) Appl. No.: 10/263,014

(22) Filed: Oct. 2, 2002

(65) Prior Publication Data

US 2003/0122112 A1 Jul. 3, 2003

Related U.S. Application Data

(60) Provisional application No. 60/327,074, filed on Oct. 3, 2001.

(51) Int. Cl.
*G02F 1/00* (2006.01)
*G02F 1/15* (2006.01)
*G02B 26/00* (2006.01)
*B01J 13/00* (2006.01)
*C08J 3/02* (2006.01)

(52) U.S. Cl. ............ 252/583; 252/586; 359/245; 359/265; 359/288; 359/290; 516/98

(58) Field of Classification Search ........... 252/582, 252/586; 359/245, 265, 288, 290
See application file for complete search history.

(56) References Cited

U.S. PATENT DOCUMENTS

| 4,451,412 | A | * | 5/1984 | Loiseaux et al. ......... 264/1.31 |
|---|---|---|---|---|
| 4,627,689 | A | | 12/1986 | Asher .................... 350/362 |
| 4,632,517 | A | | 12/1986 | Asher .................... 350/362 |
| 5,281,370 | A | | 1/1994 | Asher et al. ............. 264/1.1 |
| 5,330,685 | A | | 7/1994 | Panzer et al. ........... 252/582 |
| 5,338,492 | A | | 8/1994 | Panzer et al. ........... 252/582 |
| 5,368,781 | A | * | 11/1994 | Haacke et al. .......... 252/582 |
| 5,854,078 | A | | 12/1998 | Asher et al. ............ 436/133 |
| 5,898,004 | A | | 4/1999 | Asher et al. ............ 436/518 |
| 6,094,273 | A | * | 7/2000 | Asher et al. ............ 356/415 |
| 6,123,845 | A | * | 9/2000 | Asher et al. ......... 210/500.22 |
| 6,165,389 | A | * | 12/2000 | Asher et al. ............ 252/582 |
| 6,187,599 | B1 | | 2/2001 | Asher et al. ............ 436/531 |

(Continued)

OTHER PUBLICATIONS

Asher, S.A. et al., "Self-Assembly Motif for Creating Submicron Periodic Materials. Polymerized Crystalline Colloidal Arrays," JACS, 1994, 116, 4997.

(Continued)

*Primary Examiner*—Randy Gulakowski
*Assistant Examiner*—Timothy J. Kugel
(74) *Attorney, Agent, or Firm*—Leigh P Gregory

(57) ABSTRACT

The present invention is directed to a composite having tunable radiation diffracting properties which includes a flexible, water-free polymeric matrix and a crystalline colloidal array of particles having a lattice spacing, the array being embedded in the polymeric matrix and the lattice spacing changing responsive to stress applied to the polymeric matrix, thereby causing the radiation diffracting properties to change, wherein the polymeric matrix, the lattice spacing and the radiation diffracting properties all return to their original state essentially immediately upon removal of the stress. The present inventive composite is preferably made by a process, which involves forming a preliminary hydrogel polymerized crystalline colloidal array (PCCA), dehydrating the PCCA, and then forming a final, encapsulating polymeric matrix.

10 Claims, 2 Drawing Sheets

U.S. PATENT DOCUMENTS

| | | | | |
|---|---|---|---|---|
| 6,339,030 B1 * | 1/2002 | Constant et al. | ............ | 438/758 |
| 6,444,254 B1 * | 9/2002 | Chilkoti et al. | ............ | 427/2.24 |
| 6,544,800 B1 * | 4/2003 | Asher | ......................... | 436/531 |
| 6,632,922 B1 * | 10/2003 | Deming et al. | ............ | 530/333 |
| 6,753,191 B1 * | 6/2004 | Asher et al. | ................ | 436/531 |
| 2002/0164823 A1 * | 11/2002 | Asher et al. | ................ | 436/518 |

OTHER PUBLICATIONS

Asher, S.A. et al, "Mesoscopically Periodic Photonic-Crystal Materials for Linear and Nonlinear Optics and Chemical Sensing," *MRS Bulletin*, Oct., 1998, 44.

Busch K, and S. John, "Photonic bandgap formation in certain self-organizing systems," *Phys. Rev. E.*, 1998, 58, 3896.

Carlson, R.J. and S.A. Asher, "Characterization of Optical Diffraction and Crystal Structure in Monodisperse Polystyrene Colloids," *Applied Spectroscopy*, 1984, 38, 297.

Clark, N.A. et al, "Single Colloidal Crystals," *Nature*, 1979, 281, 57.

Flaugh, P. et al., "Development of a New Optical Wavelength Refection Filter: Demonstration of Its Utility in Raman Spectroscopy," *Applied Spectroscopy*, 1984, 38, 847.

Foulger, S.A. et al., "Mechanochromic Response of Poly (ethyleneglycol) Methacrylate Hydrogel encapsulated Crystalline Colloidal Arrays," *Langmuir*, 2001, 17, 6023.

Foulger, S.A. et al. "Robust polymer colloidal crystal photonic bandgap structures," *Optics Lett.*, 2000, 25, 1300.

Hiltner, P.A. and I.M. Krieger, "Diffraction of Light by Ordered Suspensions," *J. Phys. Chem.*, 1969, 73, 2386.

Hiltner, P.A. et al., "Diffraction of Light by Nonaqueous Ordered Suspensions," *The Journal of Physical Chemistry*, 1971, 75, 1881.

Jethmalani, J.M. and W.T. Ford, "Diffraction of Visible Light by Ordered Monodisperse Silica-Poly (methyl acrylate) Composite Films," *Chem. Mater.*, 1996,8, 2138.

Jethmalani, J.M. et al, "Optical Diffraction from Silica-Poly (methyl methacrylate) Composite Films," *Langmuir*, 1997, 13, 2633.

Jethmalani, J.M. et al, "Crystal Structures of Monodisperse Colloidal Silica in Poly (methyl acrylate) Films," *Langmuir*, 1997, 13, 3338.

John, S., "Strong Localization of Photons in Certain Disordered Dielectric Superlattices," *Phys.Rev. Lett.*, 1987, 58, 2486.

Monovoukas, Y. and A.P. Gast, "The Experimental Phase Diagram of Charged Colloidal Suspensions," *J. Colloid Interface Sci.*, 1989, 128, 533.

Monovoukas, Y. and A.P. Gast, "Microstructure Identification During Crystallization of Charged Colloidal Suspensions," *Phase Transitions*, 1990, 21, 183.

Okubo, T, "Polymer Colloidal Crystals," *Prog. Polym. Sci.*, 1993, 18, 481.

Papir, Y.S. et al, "Monodisperse Latices III: Cross-Linked Polystyrene Latices," *Journal of Paint Technology*, 1970, 42, 571.

Pendry, J.B., "Photonic band structures," *Journal of Modern Optics*, 1994, 41, 209.

Rundquist, P.A. et al, "Dynamical Bragg diffraction from crystalline colloidal arrays," *J. Chem. Phys*, 1989, 91, 4932.

Sun, F. and D.W. Grainger, "Ultrathin Self-Assembled Polymeric Films on Solid Surfaces. I. Synthesis and Characterization of Acrylate Copolymers Containing Alkyl Disulfide Side Chains," *Journal of Polymer Science: Part A: Polymer Chemistry*, 1993, 31, 1729.

Tarhan, I. And G.H. Watson, "Photonic Band Structures of fcc Colloidal Crystals," *Phys. Rev. Lett.*, 1996, 763, 315.

Woods, M.E. et al., "Monodisperse Latices: I. Emulsion Polymerization With Mixtures of Anionic and Nonionic Surfactants," *Journal of Paint Technology*, 1968, 40, 541.

Yablonovich, E., "Inhibited Spontaneous Emission in Solid-State Physics and Electronics," *Phys. Rev. Lett.*, 1987, 58, 2059.

* cited by examiner

ESSENTIALLY WATER-FREE POLYMERIZED CRYSTALLINE COLLOIDAL ARRAY COMPOSITES HAVING TUNABLE RADIATION DIFFRACTING PROPERTIES AND PROCESS FOR MAKING

CROSS-REFERENCE TO RELATED APPLICATIONS

Priority is hereby claimed to Provisional U.S. Application Ser. No. 60/327,074, which is entitled: "POLYMERIZED CRYSTALLINE COLLOIDAL ARRAY COMPOSITES HAVING TUNABLE RADIATION DIFFRACTION PROPERTIES" filed Oct. 3, 2001.

FIELD OF THE INVENTION

The present invention relates generally to radiation filters based on crystalline colloidal arrays. More specifically, the present invention is directed to a tunable radiation filter, which includes a highly ordered crystalline array of particles fixed in an essentially water-free matrix and a process for making such.

BACKGROUND OF THE INVENTION

A crystalline colloidal array (CCA) is a three dimensionally ordered lattice of self-assembled monodisperse colloidal particles, typically amorphous silica or a polymer latex, dispersed in an aqueous or non-aqueous medium. At high particle concentrations, long-range electrostatic interactions between particles result in a significant inter-particle repulsion, which yields the adoption of a minimum energy colloidal crystal structure with either body-centered cubic or face-centered cubic symmetry.

Crystalline colloidal arrays can be formed having lattice spacings comparable to the wavelengths of ultraviolet, visible and infrared radiation. It has long been recognized that an array comparable in period to the wavelength of electromagnetic waves can provide an analog, i.e., a "bandgap," which can act as a filter for a particular wavelength. Bragg diffraction techniques have been used to examine CCAs with a view towards identifying their interparticle spacing, lattice parameters and phase transitions. Because CCAs can be fabricated to diffract electromagnetic radiation, including the visible spectrum, such arrays have potential applications as optical filters, switches, limiters and sensors. However, the low elastic modulus exhibited by a liquid dispersion results in weak shear, gravitational, electric field, or thermal forces having the propensity to disturb the crystalline order and is a severe drawback to the practical application of CCAs in photonic devices.

Recently, approaches to develop robust network matrices have been pioneered to stabilize both organic and inorganic arrays through an in situ polymerization of a monomer around the ordered arrays. Specifically, colloidal crystals arrays have been stabilized through encapsulation in hydrogel networks and have been referred to as polymerized crystalline colloidal arrays (PCCAs). However, the PCCAs contain at least 30 percent by volume of water, resulting in their fragility and propensity for significant changes in optical performance with water content.

To overcome the drawbacks of the hydrogel networks CCAs have been encapsulated in essentially water-free polymeric matrices. However, one motivation for developing a more robust system was to achieve varying types of tunability, i.e., controllable changes of the CCA lattice spacings responsive to specific environmental stimuli. Yet, the water-free PCCAs that have been formed to date have exhibited limited tuning capabilities. Specifically, prior art composite films composed of silica particles in an acrylate polymeric matrix have exhibited band stop tuning responsive to mechanical stress, though the diffraction wavelength shifts were limited to about 50 nm or less and the time for the films to return to the optical characteristics of their unloaded state after the cessation of stress was from two to four hours.

Accordingly, there exists a need in the art for robust composites which exhibit radiation diffracting properties, which are tunable to a significant degree responsive to applied stress and which return to their initial optical characteristics immediately upon the cessation of stress.

SUMMARY OF THE INVENTION

Accordingly, the present invention is directed to a composite having tunable electromagnetic wave diffracting properties, which includes a flexible, essentially water-free polymeric matrix and a crystalline colloidal array of particles having an initial lattice spacing, the array embedded in the polymeric matrix, wherein the lattice spacing changes responsive to environmental stimulation applied to the polymeric matrix, thereby causing the electromagnetic wave diffracting properties to change, and wherein the array reverts to the initial lattice spacing essentially immediately upon removal of the environmental stimulation. Preferably, the particles of the crystalline colloidal array are charged particles. Preferably the particles of the crystalline colloidal array are polymeric. Alternatively, the particles of the crystalline colloidal array may be inorganic. Preferably, the essentially water-free matrix is an acrylate polymer. It is also preferred that the essentially water-free matrix is elastomeric. It is also preferred that the essentially water-free matrix is crosslinked. The electromagnetic wave diffracting properties of the composite will change responsive to environmental stimulation including mechanical stimulation, thermal stimulation, electrical stimulation, and chemical stimulation.

The present invention is also directed to a method for making a composite having tunable electromagnetic wave diffracting properties, which includes the steps of:
a) allowing colloidal particles to self-assemble into a crystalline colloidal array in a medium;
b) adding at least one hydrogel-forming monomer to the medium containing the crystalline colloidal array;
c) polymerizing the at least one hydrogel-forming monomer to form a polymerized crystalline colloidal array having a hydrogel matrix;
d) dehydrating the hydrogel matrix of the polymerized crystalline colloidal array;
e) swelling the dehydrated polymerized crystalline colloidal array with at least one monomer; and
f) polymerizing the at least one monomer thereby forming an essentially water-free polymerized crystalline colloidal array.

Preferably, the colloidal particles are charged. Preferably, the hydrogel matrix is a polyethylene glycol. Alternatively, the hydrogel matrix may be a polyacrylamide. The at least one monomer employed in swelling the dehydrated crystalline colloidal array may be a liquid monomer or a solid monomer dissolved in a solvent.

The present invention is also directed to a photonic composite having a tunable bandgap which is made by a process including the steps of:

a) allowing colloidal particles to self-assemble into a crystalline colloidal array in a medium;
b) adding at least one hydrogel-forming monomer to the medium containing the crystalline colloidal array;
c) polymerizing the at least one hydrogel-forming monomer to form a polymerized crystalline colloidal array having a hydrogel matrix;
d) dehydrating the hydrogel matrix of the polymerized crystalline colloidal array;
e) swelling the dehydrated polymerized crystalline colloidal array with at least one monomer; and
f) polymerizing the at least one monomer thereby forming an essentially water-free polymerized crystalline colloidal array;
wherein the bandgap shifts responsive to environmental stimulation.

Preferably the hydrogel matrix is a polyethylene glycol. Alternatively, the hydrogel matrix may be a polyacrylamide. Preferably, the at least one monomer employed in swelling the dehydrated polymerized crystalline colloidal array is an acrylate monomer.

Thus, the present invention is directed to a composite having tunable radiation diffracting properties which includes a flexible, water-free polymeric matrix and a crystalline colloidal array of particles having a lattice spacing, the array being embedded in the polymeric matrix and the lattice spacing changing responsive to stress applied to the polymeric matrix, thereby causing the radiation diffracting properties to change, wherein the polymeric matrix, the lattice spacing and the radiation diffracting properties all return to their original state essentially immediately upon removal of the stress.

Preferably, the polymeric matrix is elastomeric. One preferred polymer for use as the present polymeric matrix is poly(2-methoxyethyl acrylate) although any of a nearly limitless number of polymers having appropriate optical and mechanical properties may be employed.

Polystyrene particles are preferred for the crystalline colloidal array of the present invention although, hereagain, any suitable particles can be used. Examples of such include polymethylmethacrylate, silicon dioxide, aluminum oxide, polytetrafluoroethylene or any other suitable materials which are generally uniform in size and surface charge.

The CCA spacing may provide for radiation diffracting properties in the ultraviolet, visible and/or infrared portion or portions of the electromagnetic spectrum. Preferably, changes in the lattice spacing of the crystalline colloidal array effect changes in the composite radiation diffracting properties which result in diffraction wavelength shifts of as much as 55 nm or more, more preferably, as 100 nm or more. The recovery time for returning to the initial lattice spacing configuration upon removal of stress, as is evidenced by a return to a diffraction wavelength within 2 nm of the original diffraction wavelength, is less than one minute, preferably less than 10 seconds and most preferably less than two seconds.

Further, the present invention is directed to a method for making a composite having tunable radiation diffracting properties which includes the steps of:
a) allowing colloidal particles to self-assemble into a crystalline colloidal array in a medium;
b) adding at least one hydrogel-forming monomer to the medium containing the crystalline colloidal array;
c) polymerizing the at least one hydrogel-forming monomer to form a polymerized crystalline colloidal array having a hydrogel matrix;
d) dehydrating the hydrogel matrix of the polymerized crystalline colloidal array;
e) swelling the dehydrated polymerized crystalline colloidal array by adding at least one further monomer having an affinity for the hydrogel; and
f) polymerizing the at least one further monomer thereby forming an essentially water-free polymerized crystalline colloidal array.

One preferred monomer for use as the hydrogel-forming monomer is ethylene glycol. Alternatively, acrylamide may be employed. A preferred monomer for use as the at least one further monomer for forming an essentially water-free polymerized crystalline colloidal array is 2-methoxyethyl acrylate although any of a wide variety of monomers capable of forming essentially water-free polymers having appropriate optical and mechanical properties may be employed.

Polystyrene particles are preferred for forming the self-assembled crystalline colloidal array of the present invention although any suitable particles can be used. Examples of such include polymethylmethacrylate, silicon dioxide, aluminum oxide, polytetrafluoroethylene or any other suitable materials which are generally uniform in size and surface charge.

Additionally, the present invention is directed to a composite having tunable radiation diffracting properties made by a process which includes the steps of:
a) allowing colloidal particles to self-assemble into a crystalline colloidal array in a medium;
b) adding at least one hydrogel-forming monomer to the medium containing the crystalline colloidal array;
c) polymerizing the at least one hydrogel-forming monomer to form a polymerized crystalline colloidal array having a hydrogel matrix;
d) dehydrating the hydrogel matrix of the polymerized crystalline colloidal array;
e) swelling the dehydrated polymerized crystalline colloidal array by adding at least one further monomer having an affinity for the hydrogel; and
f) polymerizing the at least one further monomer thereby forming an essentially water-free polymerized crystalline colloidal array;
wherein the essentially water-free polymerized crystalline colloidal array has a lattice spacing which changes responsive to stress thereby changing the radiation diffracting properties and wherein the essentially water-free polymerized crystalline colloidal array, the lattice spacing and the radiation diffracting properties return to their original states essentially immediately upon release of the stress.

BRIEF DESCRIPTION OF THE DRAWINGS

A full and enabling disclosure of this invention, including the best mode shown to one of ordinary skill in the art, is set forth in this specification. The following Figures illustrate the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

The present invention is directed to a composite having tunable radiation diffracting properties, i.e., a tunable photonic bandgap. In essence a crystalline colloidal array (CCA) of particles is "frozen" in its optimum configuration and embedded in a flexible, water-free polymeric matrix thus forming a "photonic crystal" which can forbid photon transport for a certain band of frequencies. The lattice spacing of the CCA changes responsive to stress applied to the polymeric matrix, thereby causing the radiation diffracting properties to change. Thus, by applying a predetermined amount of stress to the polymeric matrix the composite can be tuned from one set of optical properties to another. As is noted above, similar composites have been made in the past.

However, the present composite exhibits improved optical properties, greatly improved tunability, and most importantly, the ability to recover both mechanically and optically almost immediately upon the removal of stress. These improvements are achieved by a process for forming the present composite which first locks in the original, optimum configuration of the CCA prior to forming the final polymeric matrix about the colloidal particles.

Figure 1:
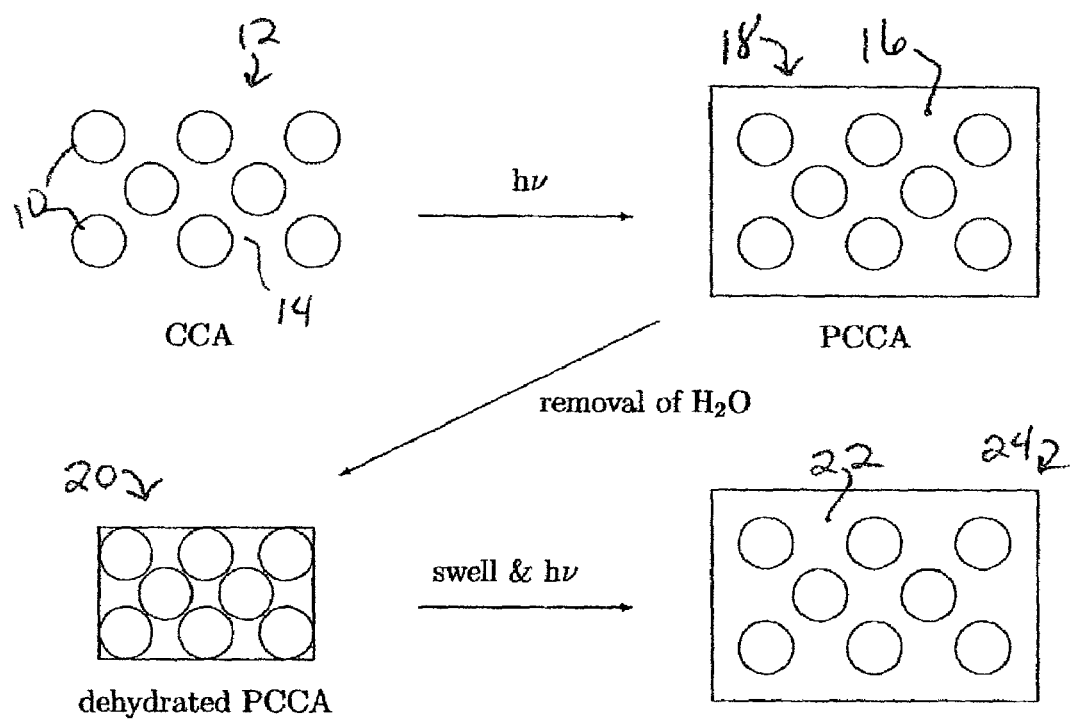
FIG. 1 is a schematic representation of the process of the present invention.

FIG. 1 schematically illustrates the present method for forming a tunable composite in accordance with the present invention. Most basically, colloidal particles 10 are allowed to self-assemble into a crystalline colloidal array 12 within a medium 14. In order to initially stabilize the array, a hydrogel-forming monomer is added to the medium 14 and polymerized, as by photoinitiated free radical polymerization, into a hydrogel 16, thereby forming a hydrogel-based polymerized crystalline colloidal array (PCCA) 18. Thereafter, the water is removed by evaporation to form dehydrated hydrogel-based PCCA 20. The dehydrated PCCA is then swollen in a liquid monomer which has a strong affinity for the hydrogel-based matrix. That monomer is then polymerized, preferably photopolymerized, into an essentially water-free polymeric matrix 22 thereby forming final composite 24.

The colloidal particles 10 can be colloidal polystyrene, polymethylmethacrylate, polybutadiene, polyisoprene, silicon dioxide, aluminum oxide, polytetrafluoroethylene or any other suitable materials which are generally uniform in size and surface charge. Colloidal polystyrene is preferred. The particles are chosen depending upon the optimum degree of ordering and the resulting lattice spacing desired for the particular application.

In general, any emulsion system including macro ions could be employed to form the CCA. In one embodiment, a CCA can be formed of a hybrid of two or more different particle types. For example, a CCA can be formed of a hybrid of two different types of organic particles or inorganic particles. Alternatively, a CCA can be formed of a hybrid of both inorganic and organic particles. In general, the macro ions utilized can be spherical in shape, though this is not a requirement.

A CCA will usually fall into one of two general categories. For example, a CCA can be a sterically packed array, in which the colloidal particles can usually be from about 10 nm to about 1 $\mu$m in diameter. Specifically, the particles can be from about 50 to about 800 nm in diameter. More specifically, the particles can be from about 200 to about 500 nm in diameter. Whatever the chosen diameter of the particles, the particles can contact each other to form an ordered, packed system.

Alternatively, a CCA can be an electrostatically stabilized system, in which the colloidal particles are produced such that they exhibit a negative surface charge. When placed in a solution which is pure and nearly free of ionic species, the repulsive interaction between the macro ions can be significant over distances greater than 1 $\mu$m. When dispersed in a polar medium at high particle concentrations, interactions between the surface charge of the particles, coupled with the consequent diffuse counterion cloud (known as a double layer effect) can result in the adoption of a minimum energy crystalline colloidal structure having either a body centered cubic (bcc) or face centered cubic (fcc) symmetry.

As noted above, these CCA systems can be fabricated to exhibit specific periodicity analogous to electromagnetic wavelengths. For example, the periodicity of the array can be analogous to electromagnetic wavelengths in the infrared, visible, or ultraviolet spectrums. This can result in the appearance of a bandgap in the spectrum. The refractive index of these systems can be further adjusted through the addition of various additives. For example, dyes, photochromic dyes, or fluorine can be incorporated into the CCA to "tune" the optical effects of the system. CCAs exhibiting optical bandgap effects can then be employed in a variety of active photonic switching and sensory roles.

The composites of the present invention have preferably been formed from electrostatically stabilized CCA systems, although sterically packed CCAs may alternatively be employed. In one embodiment, the CCAs utilized can be formed using monodisperse cross-linked polystyrene-based particles as the colloidal particles, though this is not required for practice of the invention. These particles can be prepared by using standard emulsion polymerization procedures, which are known in the art.

Specifically, an emulsion polymer colloid can be prepared by mixing the desired monomer with a cross-linking agent, a surfactant to aid in the formation of the emulsion, a buffer to keep the pH of the solution constant and to prevent particle coagulation, and a free-radical initiator to initiate polymerization. In one embodiment the monomer is styrene, the cross-linking agent is divinylbenzene, the surfactant is sodium lauryl sulfate, the initiator is potassium persulfate and, optionally, an ionic comonomer is also added, such as 1-sodium, 1-allyloxy-2-hydroxypropane sulfonate. Other suitable compounds can also be used to prepare the emulsion polymer colloid, so long as compatibility problems do not arise. The particles should then be purified by the use of centrifugation, dialysis and/or an ion exchange resin. Purification of the commercially available particles is also required.

Following polymerization, the particles may be stored in an ion exchange resin. The ion exchange resin should preferably be cleaned prior to use.

The colloidal particles employed can be of any suitable particle size, but in general will be between about 10 nanometers to about 10 microns in diameter. Specifically, the particles can be between about 20 and about 500 nanometers in diameter. More specifically, the particles can be between about 100 and about 200 nanometers in diameter.

In one possible embodiment, the resulting latex produced by the emulsion polymerization procedures can be dialyzed against deionized water and then shaken with an excess of mixed bed ion-exchange resin to remove excess electrolyte. The CCA can then be allowed to self-assemble.

The electrically charged particles are then allowed to self assemble to form a crystalline colloidal array. This assembly takes place in a suitable medium 14, preferably water.

The diffraction characteristics of CCA systems are most accurately predicted through the application of dynamic diffraction theory, though Bragg's law is a reasonable approximation. Of importance to the present invention, a CCA can be "tuned" to exhibit some desired periodicity and exhibit a specific bandgap based on the interplaner spacing of the diffracting lattice planes. Interplaner spacing in turn can be a function of the concentration of colloidal particles forming the CCA. In other words, the concentration of colloidal particles can be designed or altered in order that the CCA exhibit a specific bandgap.

Conversely, a shift in the observed bandgap of the system can be evidence of a shift in the interplaner spacing, d, of the ordered system. Such a shift in the ordered lattice structure may be attributable to some specific stimulation of the system. For example, when a CCA is formed in a deionized water system, the CCA can opalesce at a certain color due to the optical bandgap effect. If water or some other compound in the system is allowed to escape, due to, for example, evaporation, the observed bandgap can shift due to the increased concentration of the colloidal particles and the decreased interplaner spacing of the array. As such, the system will opalesce at a bluer hue due to the change in particle concentration.

Similarly, the addition of a compound to the system can cause a decrease in the concentration of colloidal particles and a relative increase in the interplaner spacing of the array, thus a red shift in the optical bandgap can be seen. As a result, such CCAs can be useful in various optical switching and sensing technologies.

Following formation of the CCA, the hydrogel monomer is added and polymerized to form an encapsulated hydrogel polymerized crystalline colloidal array (PCCA). The PCCA can be formed by any suitable method. In general, such methods can be thin film formation methods. This could include lithography methods, such as, for example, photolithography, various forms of near-field optical lithography, and soft lithography. Alternatively, other forms of thin film formation could be utilized such as surface templating, layer-by-layer assembly methods, pulsed laser deposition methods, or through polymerization of the CCA/monomer blend solution within a defined area. For example, in one embodiment, the CCA/monomer solution can be an aqueous solution including a photoinitiator injected between two quartz plates separated by a Parafilm spacer and then polymerized into a PCCA hydrogel through exposure to an ultraviolet electromagnetic radiation source for a suitable period of time. In general, no matter what method of production is used, the product PCCA can have a size defined by the desired final application of the film. For example, the PCCA film can be from about 1 to about 1500 $\mu$m thick and have length and width dimensions as required.

To provide for more efficient polymerization of the monomer, a polymerization initiator can be added to the CCA/monomer blend. For example, in one embodiment, the polymerization process can be a photopolymerization process. Photopolymerization, though not required, has proven effective due to the limitation of possible disturbing forces which could disrupt the ordered system. In this particular embodiment, a photoinitiator can be added to the CCA/monomer blend. Any suitable photoinitiator can be used such as, for example, benzoin methyl ether (BME) or 2,2'-diethoxyacetophenone (DEAP). Usually, only a small amount of a photoinitiator is necessary for polymerization of the monomer to occur. For example, ratios of photoinitiator to monomer can be from about 1:100 to about 5:100 to effect polymerization as desired.

Upon polymerization, the hydrogel polymer can form either a thermoplastic or a thermoset network, as desired, around the ordered colloidal particles. If a thermoset polymerized system is desired, a crosslinking agent may be added to the CCA/monomer blended system prior to polymerization. In general, a crosslinking agent can be added to the monomer in a ratio of from about 1:5 to about 1:20 (crosslinking agent to monomer). More specifically, the ratio of crosslinking agent to monomer can be from about 1:8 to about 1:15.

Any suitable crosslinking agent can be utilized. In general, in an embodiment involving a polyethylene glycol (PEG)-based hydrogel PCCA, the crosslinking agent can also be a PEG-based agent, though this is not a requirement. A non-exhaustive list of possible crosslinking agents can include, but is not limited to: poly(ethylene glycol) dimethacrylate, poly(ethylene glycol) diacrylate, poly(ethylene glycol) divinyl ether, poly(ethylene glycol) dioleate, and N,N' methylene bis acrylamide.

Thus, preferably, a hydrogel-forming monomer is then added to the crystalline colloidal array medium, along with a cross-linker and a photoinitiator. Monomers of poly(acrylamide) and its derivatives are well known as hydrogel-formers and may be employed in accordance with the present invention. However, poly(ethylene glycol) (PEG) hydrogels are preferred in accordance with the present invention as it has been determined that networks based on PEG may provide more versatile tuning properties. Of course, a variety of other hydrogel homopolymers and copolymers may also be advantageously employed in accordance with the present invention depending on compatibility with the subsequent, final matrix chemistry. In the preferred embodiment, however, the hydrogel-forming monomer is a monomer of poly(ethylene glycol) methacrylate, the cross-linker is poly(ethylene glycol) dimethacrylate, and the photoinitiator is 2,2-diethoxyacetophenone. Photopolymerization, accomplished by exposure to a UV source in the presence of a photoinitiator, is the preferred means for forming the present hydrogel.

Following its formation, the hydrogel matrix containing the embedded crystalline colloidal array is completely dehydrated to form dehydrated polymerized crystalline colloidal array 20. Preferably, the PCCA is allowed to air dry for a period of days and then placed in a vacuum oven in order to ensure complete dehydration.

Following dehydration, the dehydrated PCCA is then swollen with a liquid monomer or monomers that will eventually form the matrix 22 of final composite 24. Any of a wide variety of polymers may be employed for matrix 22 depending on the properties desired for the overall composite. In fact, it has been determined in accordance with the present invention that at least the thermal and mechanical properties of the final composite are determined almost exclusively by the final matrix polymer employed and are not affected significantly by the compositions of the colloidal particles or the hydrogel. However, certain considerations must be taken into account in choosing an appropriate matrix polymer.

Primarily, the monomer or monomers which will eventually form the final matrix polymer must have an affinity for the hydrogel. Basically, this affinity may be viewed as an indication of mutual solubility such that a monomer which has an affinity for a given hydrogel will readily swell the dehydrated hydrogel PCCA like water swelling a dried sponge. A monomer which does not have an affinity for the particular hydrogel which has been employed will be repelled by the dehydrated hydrogel PCCA and will not swell it. Of course, this required affinity can be anticipated and employed as a determining factor in choosing an appropriate hydrogel which is compatible to a desired final matrix polymer. Thus, for a PEG hydrogel, a preferred monomer is a PEG functionalized acrylate such as 2-methoxyethyl acrylate.

Also of primary importance is that the monomer or monomers employed must be a precursor or precursors to an essentially water-free matrix. That is, when polymerized the monomer or monomers must form a homopolymer or copolymer which is not a hydrogel. The formation of an essentially water-free, non-hydrogel, polymeric matrix is key to achieving the robust, readily tunable composite of the present invention.

Secondly, it is preferred that the monomer which swells the dehydrated hydrogel PCCA and eventually forms the final matrix polymer is a liquid. However, a solid monomer dissolved in an appropriate solvent may also be employed.

Finally, depending on the particular end-use application, it may be desirable for the final composite to possess certain optical, thermal and/or mechanical properties. As was noted above, these may all be tailored by choosing an appropriate matrix polymer. For example, although a preferred monomer for forming the final matrix polymer is 2-methoxyethyl acrylate, it has been found in accordance with the present invention that the glass transition temperature of the final composite can be altered by copolymerization of additional acrylate monomers or through a complete substitution. For example, the glass transition temperature of the composite made in accordance with Example 2, below, is about −35° C. The glass transition temperature of the composite made in accordance with Example 3, below, is in the range of 40–50° C. The composite made in accordance with Example 4, below, has a copolymer matrix wherein the dehydrated hydrogel PCCA has been swollen with a 50/50 blend of 2-methoxyethyl acrylate and 2-methoxyethyl methacrylate, the two monomers employed in Examples 2 and 3, respectively. Thus, the composite of Example 4 has a glass transition temperature between those other two composites. Thus, in one preferred embodiment, 2-methoxyethyl acrylate including 1% by weight of ethylene glycol dimethacrylate is employed to swell the dehydrated PEG-based hydrogel PCCA. A photoinitiator such as 2,2-diethoxyacetophenone is added. Subsequent photopolymerization yields a water-free, robust composite.

Preferably, the polymer chosen for use as the final composite matrix material is sufficiently flexible, most preferably elastomeric, in order to provide a final composite which is capable of exhibiting mechanochromic properties. That is, deformation of the matrix by applied stress causes deformation of the embedded crystalline colloidal array lattice spacing and, therefore, a change in the radiation diffracting properties of the composite. However, it should be noted that present inventive composite may be tailored to exhibit tunability responsive to other environmental stimuli such as, for example, changes in temperature, exposure to certain chemicals, or exposure to electric or electromagnetic fields.

A particular advantage of the present invention, however, is the ability to provide PCCA composites which are tunable responsive to applied stress and, most particularly, which are capable of returning to the original unstressed state, both physically and optically, within seconds of removal of the applied stress. That is, upon removal of applied stress composites in accordance with the present invention return to a diffracted bandwidth within 1 to 2 nanometers of the original unstressed bandwidth essentially immediately.

Reference now will be made to possible embodiments of the invention, one or more examples of which are set forth below. Each example is provided by way of explanation of the invention, not as a limitation of the invention. In fact, it will be apparent to those skilled in the art that various modifications and variations can be made in this invention without departing from the scope or spirit of the invention. For instance, features illustrated or described as part of one embodiment can be used on another embodiment to yield a still further embodiment. Thus, it is intended that the present invention cover such modifications and variations as come within the scope of the appended claims and their equivalents.

EXAMPLE 1

Monodisperse crosslinked polystyrene particles were prepared using an emulsion polymerization procedure which involved mixing styrene monomer with divinylbenzene, a cross-linking agent, sodium lauryl sulfate, a surfactant, and potassium persulfate, a free-radical initiator for initiating polymerization. The resulting particles were dialyzed against deionized water and then shaken with an excess of mixed bed ion-exchange resin. After cleaning, the particle diameter was measured to be 109±26 nm. The cleaned suspension with then diluted with deionized water until an angle dependent iridescence was observed. Drying a known mass of the suspension in an oven at 80° C. overnight then under vacuum for two days resulted in a calculated particle density of $2.6 \times 10^{14}$ cm$^{-3}$.

The crystalline colloidal arrays which formed in the deionized water were encapsulated in a hydrogel matrix prepared by an in situ photopolymerization procedure. The matrix materials included a monomer of poly(ethylene glycol) methacrylate (PEGMA, $M_n$=360), a crosslinker of poly(ethylene glycol) dimethacrylate (PEGDMA, $M_n$=550), and a photoinitiator of 2,2-diethoxyacetophenone (DEAP). The PEGMA and PEGDMA were stored in Nalgene® (Nalge Nunc Int'l Corp., Rochester. N.Y.) plastic laboratory containers over a mixed bed ion-exchange resin for at least 48 hours prior to their use, while all other matrix materials were used as-received.

The procedure for generating a hydrogel polymerized crystalline colloidal array film included combining all the components of the PCCA in a Nalgene® container and allowing the mixture to shake with an excess of a mixed bed ion-exchange resin for at least two hours prior to injecting the mixture between two quartz plates separated by a 500 μm parafilm spacer. The film was then polymerized by exposing the assembly to a UV source for four minutes.

EXAMPLE 2

A hydrogel PCCA film made in accordance with Example 1 was removed from the quartz plates and allowed to air dry for two days and then placed in a vacuum oven at 35° C. The resulting clear film was then swollen in a solution of 2-methoxyethyl acrylate for two days. To this solution, ethylene glycol dimethacrylate and DEAP was added and the formulation was crosslinked by a twenty-minute exposure to a UV lamp. All chemicals were purchased from either Aldrich or Acros Organics.

Figure 2:
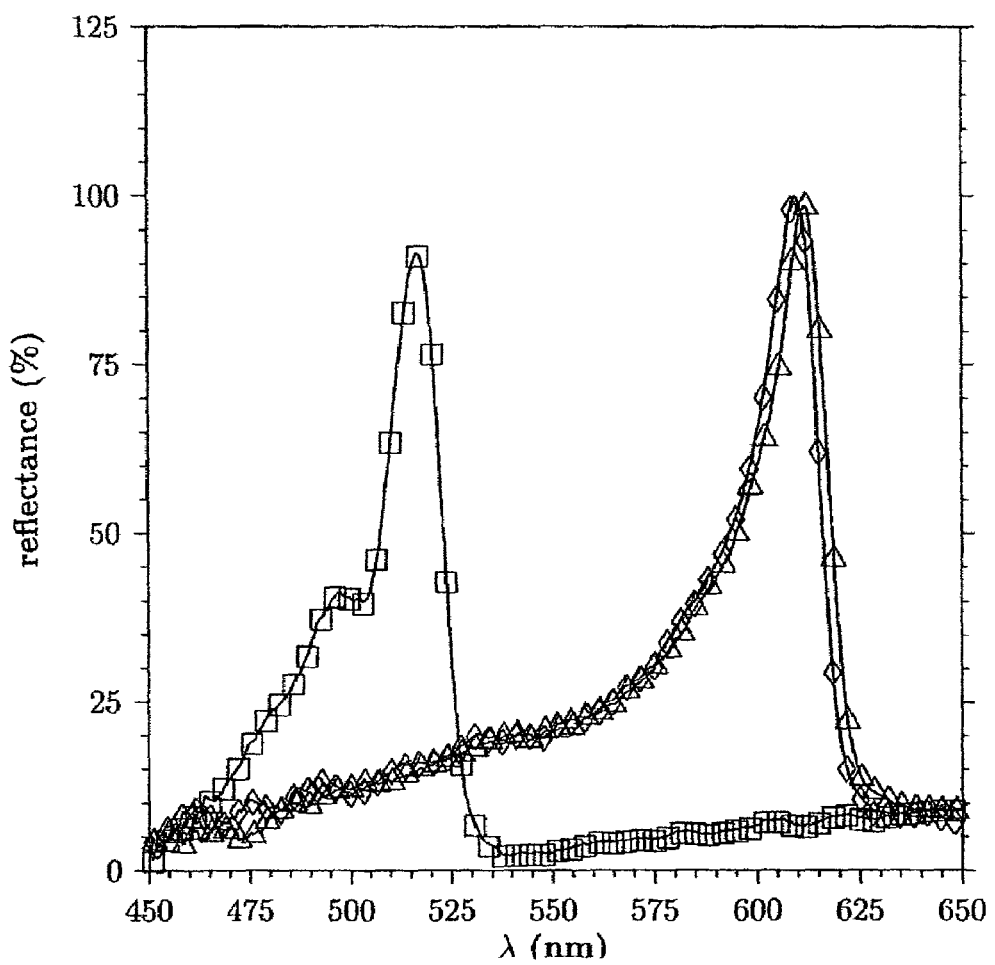
FIG. 2 is reflectance spectra of a composite in accordance with the present invention prior to, during, and following the application of 145 kPa compressive stress.

FIG. 2 is a reflectance spectra of the composite of the present Example collected on an Ocean Optics PC2000 fiber optic spectrometer taken at normal incidence in an initial stress-free state, under a compressive loading, and upon removal of the applied stress. In the initial stress-free state, the position of the band stop is at 610 nm. Upon applying a 145 kPa compressive stress, the band stop shifts down to a wavelength of 517 nm, a 93 nm variation. Additional compressive stress resulted in increasingly larger band stop shifts, with shifts of 120 nm being attainable. However, with increasing stress, the peaks became broader and less well defined due to the introduction of disorder in the array. As is shown in FIG. 2, removal of the compressive stress results in the immediate return of the band stop position within 1–2 nm of the original stress-free state. It was found that repeated straining of a composite in accordance with the present invention did not result in any permanent change in the observed optical characteristics unless the film was mechanically degraded.

EXAMPLE 3

A hydrogel PCCA film made in accordance with Example 1 was removed from the quartz plates and allowed to air dry for two days and then placed in a vacuum oven at 35° C. The resulting clear film was then swollen in a solution of 2-methoxyethyl methacrylate for two days. To this solution, ethylene glycol dimethacrylate and DEAP was added and the formulation was crosslinked by a twenty-minute exposure to a UV lamp. All chemicals were purchased from either Aldrich or Acros Organics.

EXAMPLE 4

A hydrogel PCCA film made in accordance with Example 1 was removed from the quartz plates and allowed to air dry for two days and then placed in a vacuum oven at 35° C. The resulting clear film was then swollen in a 50/50 solution of 2-methoxyethyl acrylate and 2-methoxyethyl methacrylate for two days. To this solution, ethylene glycol dimethacrylate and DEAP was added and the formulation was crosslinked by a twenty-minute exposure to a UV lamp. All chemicals were purchased from either Aldrich or Acros Organics.

These and other modifications and variations to the present invention may be practiced by those of ordinary skill in the art, without departing from the spirit and scope of the present invention, which is more particularly set forth in the appended claims. In addition, it should be understood that aspects and various embodiments may be interchanged either in whole or in part. Furthermore, those of ordinary skill in the art will appreciate that the foregoing description is by way of example only, and is not intended to limit the invention so further described in such appended claims.

What is claimed is:

1. A method for making a composite having tunable electromagnetic wave diffracting properties comprising the steps of:
   a) allowing colloidal particles to self-assemble into a crystalline colloidal array in a medium;
   b) adding at least one hydrogel-forming monomer to the medium containing the crystalline colloidal array;
   c) polymerizing the at least one hydrogel-forming monomer to form a polymerized crystalline colloidal array having a hydrogel matrix;
   d) dehydrating the hydrogel matrix of the polymerized crystalline colloidal array;
   e) swelling the dehydrated polymerized crystalline colloidal array with at least one monomer; and
   f) polymerizing the at least one monomer thereby forming an essentially water-free, non-hydrogel polymerized crystalline colloidal array.

2. The method set forth in claim 1 wherein said colloidal particles are charged.

3. The method set forth in claim 1 wherein the hydrogel matrix comprises a polyethylene glycol.

4. The method set forth in claim 1 wherein the hydrogel matrix comprises a polyacrylamide.

5. The method set forth in claim 1 wherein the step of swelling the dehydrated polymerized crystalline colloidal array with at least one monomer comprises swelling the dehydrated polymerized crystalline colloidal array with a liquid monomer.

6. The method set forth in claim 1 wherein the step of swelling the dehydrated polymerized crystalline colloidal array with at least one monomer comprises swelling the dehydrated polymerized crystalline colloidal array with a solid monomer dissolved in a solvent.

7. A photonic composite having a tunable bandgap made by a process comprising the steps of:
   a) allowing colloidal particles to self-assemble into a crystalline colloidal array in a medium;
   b) adding at least one hydrogel-forming monomer to the medium containing the crystalline colloidal array;
   c) polymerizing the at least one hydrogel-forming monomer to form a polymerized crystalline colloidal array having a hydrogel matrix;
   d) dehydrating the hydrogel matrix of the polymerized crystalline colloidal array;
   e) swelling the dehydrated polymerized crystalline colloidal array with at least one monomer; and
   f) polymerizing the at least one monomer thereby forming an essentially water-free polymerized crystalline colloidal array;
wherein the bandgap shifts responsive to environmental stimulation.

8. The photonic composite set forth in claim 7 wherein the hydrogel matrix comprises a polyethylene glycol.

9. The photonic composite set forth in claim 7 wherein the hydrogel matrix comprises a polyacrylamide.

10. The photonic composite set forth in claim 7 wherein the at least one monomer employed in swelling the dehydrated polymerized crystalline colloidal array comprises an acrylate monomer.

* * * * *